United States Patent [19]

Hyeon et al.

[11] Patent Number: 6,063,542
[45] Date of Patent: May 16, 2000

[54] POLYMER FOR POSITIVE PHOTORESIST AND CHEMICAL AMPLIFICATION POSITIVE PHOTORESIST COMPOSITION COMPRISING THE SAME

[75] Inventors: Park Joo Hyeon; Kim Ji Hong; Kim Ki Dae; Park Sun Yi; Kim Seong Ju, all of Taejeon, Rep. of Korea

[73] Assignee: Korea Kumho Petrochemical Co., Ltd., Seoul, Rep. of Korea

[21] Appl. No.: 09/057,053

[22] Filed: Apr. 8, 1998

[30] Foreign Application Priority Data

Apr. 8, 1997 [KR] Rep. of Korea ............... 97-13338

[51] Int. Cl.$^7$ .................................................. G03F 7/004
[52] U.S. Cl. ...................... 430/270.1; 430/905; 430/910; 526/272; 526/283
[58] Field of Search ............... 430/270.1, 905, 430/910; 526/272, 283, 271

[56] References Cited

U.S. PATENT DOCUMENTS

| | | | |
|---|---|---|---|
| 5,585,219 | 12/1996 | Kaimoto et al. | 430/270.1 |
| 5,635,332 | 6/1997 | Nakano et al. | 430/270.1 |
| 5,843,624 | 12/1998 | Houlihan et al. | 430/296 |

FOREIGN PATENT DOCUMENTS 789278  8/1997  European Pat. Off. .

*Primary Examiner*—John S. Chu
*Attorney, Agent, or Firm*—Harrison & Egbert

[57] ABSTRACT

A polymer having a repeating unit represented by the following general formula I and a chemical amplification positive photoresist composition comprising the copolymer and a photoacid generator. The hydroxy group introduced into the polymer gives a great contribution to the adhesiveness of the composition to substrate and allows the composition to be applied to any substrate. In addition, the photoresist composition is superior in resolution, thermal resistance, etch resistance, and post-exposure storage stability and can be developed without changing the concentration of developing solution.

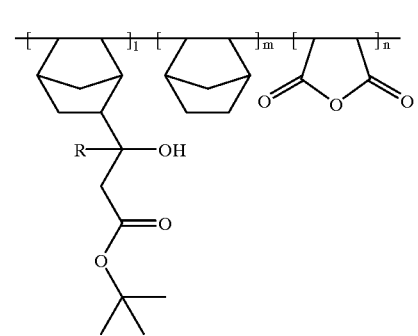

3 Claims, No Drawings

POLYMER FOR POSITIVE PHOTORESIST AND CHEMICAL AMPLIFICATION POSITIVE PHOTORESIST COMPOSITION COMPRISING THE SAME

BACKGROUND OF THE INVENTION

1. Field of the Invention

The present invention relates to a polymer for positive photoresist and a chemical amplification positive photoresist composition comprising the same. More particularly, the present invention relates to a polymer for positive photoresist, which gives a resolution as small as quarter-microns and shows superior adhesiveness to any substrate in addition to being developable without changing the concentration of developing solution and to a chemical amplification positive photoresist composition.

2. Description of the Prior Art

The high integration of semiconductor devices has been partly, but critically based on a significant advance in lithography. For example, ultra-fine patterns as small as quarter-microns in size are required for the fabrication of ultra-LSI. Accordingly, the light sources used to form the fine patterns become shorter and shorter in wavelength, for example, from g-line to l-line and deep uv light, further to KrF excimer lasers, and finally to electron beams.

Since the photoresists utilizing g-line or l-line, which belong largely to novolak-quinones, show large absorption peaks at the wavelength range of deep uv or KrF excimer laser, such a fine pattern is not obtainable therefrom. Thus, there was a strong demand for a material which little absorbs the light belonging to such wavelength ranges. In response to the demand, active research has been directed to the development of the chemical amplification photoresists based on polyhydroxystyrene derivatives, which are smaller in absorbance at such ranges than are novolak-quinonediazides. The chemical amplification photoresists based on polyhydroxystyrene derivatives, however, were found to be unsuitable for utilizing an ArF excimer laser since they show a large absorbance at the wavelength of the light source (193 nm).

As an alternative, polyacrylate derivatives appeared to avoid the absorption. Polyacrylate derivatives show little absorbance at 193 nm but are inferior to novolak resins or polyhydroxystyrene derivatives in etch resistance. In the last few years, much effort has been made to overcome the disadvantage, including the introduction of alicyclic derivatives in polyacrylate (Proc. SPIE, 1996, 2724, 365) and cycloolefin derivatives into the main chain of base resin (Proc. SPIE, 1996, 2724, 355). These methods, however, have not yielded satisfactory results, such as fine patterns as small as quarter-microns.

Collectively, the conventional chemical amplification photoresists have significant disadvantages of being high in absorbance at the short wavelength ranges of deep uv, KrF excimer laser or ArF excimer laser so as not to yield satisfactorily fine patterns as small as quarter-microns, in addition to being poor in etch resistance.

SUMMARY OF THE INVENTION

The intensive and thorough research repeated by the present inventors aiming to develop a base resin for photoresist with which the above problems encountered in prior arts can be overcome, resulted in finding that the presence of hydroxy groups in a base resin improves the adhesiveness thereof and renders it capable of being developed without changing the concentration of developing solution and that the introduction of cycloolefin into the main chain render it possible to prepare photoresists which are of high sensitivity, resolution, thermal resistance and post-exposure storage stability as well as are able to be developed into resist patterns irrespective of the kinds of substrates.

Therefore, it is an object of the present invention to provide a copolymer as a base resin for photoresist, with which there can be obtained sufficiently fine patterns for the high integration of semiconductor devices.

It is another object of the present invention to provide a chemical amplification positive photoresist composition consisting essentially of the resin and a photoacid generator.

DETAILED DESCRIPTION OF THE INVENTION

The intensive research repeated by the inventors resulted in the finding that a polymer in which a bicyclic compound, such as norbornene, exists as a member of its main chain, shows little absorbance at 193 nm but is superior in etch resistance and that introduction of hydroxy group into a polymer contributes a great improvement in adhesiveness of the polymer to substrate. Accordingly, the present invention provides a polymer for positive photoresist, having a repeating unit represented by the following general formula I:

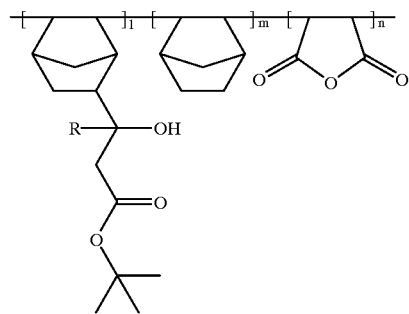

wherein, R is hydrogen or alkyl; and l, m, and n each are a repeating number satisfying the condition that $l+m+n=1$, $0.1 \leq l/(m+n) \leq 0.5$, $0 \leq m/(l+n) \leq 0.5$ and $0.1 \leq n/(l+m) \leq 0.9$.

The repeating unit of the Formula I can be prepared by polymerizing the monomers represented by the following structural formula II, maleic anhydrides of the following structural formula IV and optionally norbornenes of the following structural formula III in the presence of a polymerization catalyst.

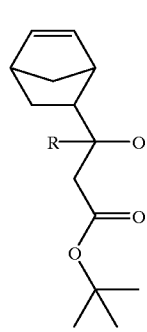

II

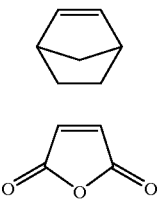

wherein R is hydrogen or alkyl. That is, the base resin of the present invention is a copolymer of the monomer of the Formula II and the maleic anhydride of the Formula IV or a terpolymer of the monomers of the Formulas II, III and IV.

The norbornene monomer of the Formula III is added at an appropriate amount under control depending on the concentration of the developing solution used. For example, high basicity of the developing solution requires a large quantity of the norbornene monomer.

These copolymers or terpolymers prepared from the monomers may be in the form of a block copolymer, a random copolymer or a graft copolymer.

Preferably, the polymer of the Formula I is prepared by the action of a radical initiator. For this radical polymerization, an available initiator may be azobisisobutyronitrile, benzoylperoxide, laurylperoxide, azobisisocapronitrile, or azobisisovaleronitrile t-butylhydroperoxide, but is not specifically limited to them. The polymerization of the monomers may be carried out in a manner of bulk polymerization, solution polymerization, suspension polymerization, bulk-suspension polymerization or emulsion polymerization. Examples of polymerization solvent include benzene, toluene, xylene, hallogenobenzene, diethylether, tetrahydrofuran, esters, lactones, ketones, amides and mixtures thereof.

Depending on the polymerization catalyst employed, the temperature for the polymerization is selected suitably. For example, if azobisisobutyronitrile is used as a polymerization catalyst, the polymerization is preferably carried out at a temperature of about 60–90° C.

As for the molecular weight of the polymer prepared, it can be controlled by varying the amount of polymerization initiator and the polymerization time. After completion of the polymerization, the monomer residue left in the reaction mixture should be at an amount of 10% by weight or less compared with the weight of the polymer produced and preferably 3% by weight or less. Where the un-reacted monomers remain at amount of 3% by weight or more, they are preferably removed by vacuum evaporation or solvent precipitation. The polymer of the Formula I has a polystyrene-reduced average molecular weight ranging from about 1,000 to 1,000,000 and preferably from about 5,000 to 40,000 when taking into account the sensitivity, developability, coatablility and thermal resistance which are required for a photoresist. For example, if the polymer has a polystyrene-reduced average molecular weight less than 5,000, the resulting photoresist composition is poor in coatability. On the other hand, if the polystryene-reduced average molecular weight exceeds 70,000, degradation occurs in sensitivity, resolution and developability. The polymer of the invention ranges, in molecular weight distribution (Mw/Mn), from 1 to 5 and preferably from 1.0 to 1.9.

The polymer of the invention is useful for forming a positive photoresist pattern as small as quarter-microns. Therefore, in accordance with another aspect of the present invention, there is provided a chemical amplification positive photoresist composition comprising the polymer and a photoacid generator.

As the photoacid generator useful in the present invention, an onium salt, such as iodonium, sulfonium, phosphonium, diazonium and pyridonium, will suffice. Non-limitative, concrete, particularly preferable examples of the onium salt include triphenylsulfonium triflate, diphenyl(4-methylphenyl)sulfonium triflate, diphenyl(4-t-butylphenyl) sulfonium triflate, diphenyl(4-methoxyphenyl)sulfonium triflate, dibutyl(naphthalen-1-yl)sulfonium triflate, triphenylsulonium hexafluoroantimonate, diphenyliodoniu m triflate, diphenyliodonium methylbenzenesulfonate, bis (cyclohexylsulonyl)diazomethane, and bis(2,4-dimethylphenylsulfonyl)diazomethane. A halogen compound also can be used as the photoacid generator, which is exemplified by 1,1-bis(4-chlorophenyl)-2,2,2-tricholorethane, phenyl-bis(trichloromethyl)-s-triazine or naphthyl-bis(trichloromethyl)-s-triazine. Besides, diazoketone compounds, such as 1,3-diketo-2-diazo, diazobenzoquinone and diazonaphthoquinone, sulfonic compounds, sulfonic acid compounds, and nitrobenzyl compounds may be candidates for the photoacid generator. More preferable are the onium compounds and the diazoketone compounds. The photoacid generator is used at an amount of approximately 0.1–30 parts by weight based on 100 parts by weight of the solid content of the photoresist composition, and preferably at an amount of 0.3–10 parts by weight. They may be used alone or in mixture of at least two species.

Optionally, there may be used a compound which is decomposed by acid to promote the dissolution of the photoresist in a developing solution. Examples of the acid-decomposable and dissolution-promoting compound include t-butylester-containing alicyclic derivatives. It may be used at an amount of approximately 5–80 parts by weight based on 100 parts by weight of the solid content of the photoresist composition, and preferably at an amount of approximately 10–50 parts by weight.

The photoresist composition of the present invention may, if necessary, comprise an additive(s), such as surfactant, azo compounds, halation inhibitor, adhesive aid, preservation stabilizer and antifoaming agent. As for surfactant, it may be exemplified by polyoxylauryl ether, polyoxyethylenestearyl ether, polyoxyethyleneoleyl ether, polyethyleneglycol dilaurate, etc. The surfactant is preferably used at an amount of 2 parts by weight or less based on 100 parts by weight of the solid content of the photoresist composition.

When being exposed to light, the photoacid generator generates acid, which plays a great role in determining the sensitivity of the photoresist. In order to limit its diffusion, a base additive may be used. Amine or ammonium compounds are useful. Representative are triphenylamine and tetramethyl ammonium, respectively. It is preferable that the base compound is used at an amount of approximately 0.05–5 parts by weight on the basis of the total solid content. For example, if the base compound is added at an amount more than the upper limit, the diffusion of the acid is reduced, but the sensitivity is lowered.

Appropriate evaporation rate and viscosity of solvent is required to obtain a uniform and smooth photoresist coat. Examples of such a solvent include ethyleneglycol monomethylether, ethyleneglycol monoethylether, ethyleneglycol monopropylether, ethyleneglycol monobutylether, diethyleneglycol dimethylether, diethyleneglycol diethylether, diethyleneglycol dipropylether, diethyleneglycol dibutylether, methylcellosolve acetate, ethylcellosolve acetate, propyleneglycol monomethylether acetate, propyleneglycol monoethylether acetate, propyleneglycol monopropylether acetate, methylethylketone, cyclohexanone, methyl 2-hydroxypropionate, ethyl 2-hydroxypropionate, 2-heptanone, N-methylpyrrolidone, N,N-dimethylformamide, N,N-dimethylacetamide, ethylpyruvate, n-amylacetate, ethyl lactate, and gamma-butyrolacetone. They, if necessary, may be used alone or in combination. Depending on its physical properties, such as volatility and viscosity, the solvent is used at such an appropriate amount that the photoresist coat is uniformly formed on a wafer.

A photoresist film is typically obtained by coating the photoresist solution on a wafer and drying it. After filtering the photoresist solution, a spin coating, flow coating or roll coating technique may be employed, Then, the photoresist film coated is selectively irradiated, so as to give fine patterns. The available radiation, although it is not specifically limited, may be uv light, such as l-line, deep uv light, such as excimer laser, or charged particle beam, such as electron beam, and is wholly dependent on the photoacid generator used. Following the radiation, thermal treatment may be optionally done to improve the sensitivity of the film.

The final step of the formation of photoresist pattern is generally carried out in a developing solution. Examples of the developing solution include aqueous solutions of sodium hydroxide, potassium hydroxide, sodium carbonate, sodium silicate, sodium metasilicate, ammonia water, ethyl amine, n-propyl amine, triethyl amine, tetramethylammonium hydroxide and tetraethylammonium hydroxide with preference to tetramethylammonium hydroxide. If necessary, additives, such as surfactants and aqueous alcohols, may be added.

A better understanding of the present invention may be obtained in light of the following examples which are set forth to illustrate, but are not to be construed to limit, the present invention.

SYNTHESIS EXAMPLE I 29.6 g of the monomer represented by the following formula V, (3-bicyclo[2.2.1]hept-5-en-2-yl-3-hydroxypropionic acid t-butyl ester), 11.7 g of norbornene, 24.3 g of maleic anhydride and 215 mg of asobisisobutyronitrile (AIBN) were dissolved in 65 ml of toluene in a reactor which was completely purged with a nitrogen atmosphere and the reaction was stirred for 24 hours at an elevated temperature of 80° C. After being cooled to room temperature, the reaction mixture was dropwise added in excess methanol in a beaker to give white precipitates. They were filtered and the filtrate was washed with methanol and dried in vacuo, to yield 15.3 g of Resin A: polystyrene-reduced average molecular weight 17,000.

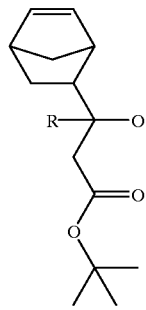

SYNTHESIS EXAMPLE II 44.4 g of the monomer represented by the Formula V, 5.8 g of norbornene, 24.3 g of maleic anhydride and 244 mg of AIBN were dissolved in 74 ml of toluene in a reactor which was completely purged with a nitrogen atmosphere and the reaction was stirred for 24 hours at an elevated temperature of 80° C. After being cooled to room temperature, the reaction mixture was dropwise added in excess methanol in a beaker to give white precipitates. They were filtered and the filtrate was washed with methanol and dried in vacuo, to yield 18.6 g of Resin B: polystyrene-reduced average molecular weight 15,000.

SYNTHESIS EXAMPLE III 59.2 g of the monomer represented by the Formula V, 24.3 g of maleic anhydride and 274 mg of AIBN were dissolved in 83 ml of toluene in a reactor which was completely purged with a nitrogen atmosphere and the reaction was stirred for 24 hours at an elevated temperature of 80° C. After being cooled to room temperature, the reaction mixture was dropwise added in excess hexane in a beaker to give white precipitates. They were filtered and the filtrate was washed with methanol and dried in vacuo, to yield 24.2 g of Resin C: polystyrene-reduced average molecular weight 12,000.

EXAMPLE I 100 weight parts of the Resin A obtained in Synthesis Example I and 1.0 weight part of triphenylsulfonium triflate were dissolved in 400 weight parts of methyl 3-methoxypropionate. The solution was filtered through a 0.1 µm membrane filter to give a positive photoresist solution.

This was coated on a silicon wafer with the aid of a spinner and the coat was dried at 110° C. for 60 sec to give a resist film 0.6 µm thick. It was exposed through a pattern chrome mask to an ArF excimer laser of 193 nm in a steper. After the exposure, the film was baked at 110° C. for 90 sec.

A developing process was carried out with the wafer for 60 sec in a 2.38 wt % tetramethylammonium hydroxide solution in water and drying it, to form a line-and-space resist pattern 0.3 µm wide.

This resolution was obtained at an exposure energy of 42 mJ/cm$^2$ and the pattern was almost rectangular in cross sectional shape, but some acid diffusion occurred.

EXAMPLE II 100 weight parts of the Resin A obtained in Synthesis Example I and 5.0 weight parts of triphenylsulfonium triflate were dissolved in 400 weight parts of methyl 3-methoxypropionate. A resist pattern was formed from the solution in a similar manner to that of Example I, except that tetramethyl ammoniumhydroxide was used at an amount of approximately 40 mol % based on the photoacid generator. The resist pattern was a line-and-space pattern 0.25 μm wide with a clear rectangular cross section.

EXAMPLE III

A resist pattern was formed in a similar manner to that of Example II, except for using 4.5 weight parts of triphenylsulfonium hexafluoroantimonate, instead of 5.0 weight parts of triphenylsulfonium triflate. The resist pattern was a line-and-space pattern 0.20 μm wide with a clear rectangular cross section, which was free of the influence of standing waves. The exposure energy was 26 mJ/cm$^3$.

EXAMPLE IV 100 weight parts of the Resin B obtained in Synthesis Example II and 5.4 weight parts of triphenylsulfonium triflate were dissolved in 400 weight parts of methyl 3-methoxypropionate. A resist pattern was formed from the solution in a similar manner to that of Example I, except that tetramethyl ammoniumhydroxide was used at an amount of approximately 45 mol % based on the photoacid generator. The resist pattern was a line-and-space pattern 0.25 μm wide with a clear rectangular cross section. The exposure energy was 74 mJ/cm$^2$.

EXAMPLE V

A resist pattern was formed in a similar manner to that of Example IV, except for using 4.6 weight parts of triphenylsulfonium hexafluoroantimonate, instead of 5.4 weight parts of triphenylsulfonium triflate. The resist pattern was a line-and-space pattern 0.25 μm wide with a clear rectangular cross section. The exposure energy was 35 mJ/cm$^3$.

EXAMPLE VI 100 weight parts of the Resin C obtained in Synthesis Example III and 1.2 weight parts of triphenylsulfonium triflate were dissolved in 400 weight parts of methyj 3-methoxypropionate. The solution was filtered through a 0.1 μm membrane filter to give a positive photoresist solution.

This was coated on a silicon wafer with the aid of a spinner and the coat was dried at 90° C. for 90 sec to give a resist film 0.7 μm thick. It was exposed through a pattern chrome mask to an ArF excimer laser of 193 nm in a steper. After the exposure, the film was baked at 120° C. for 60 sec.

A resist pattern was formed by developing the wafer in a 10-fold diluted 2.38 wt % tetramethylammonium hydroxide solution in water for 60 sec. washing and drying it. The 10-fold dilution was attributed to the fact that the polymer was highly soluble to alkaline solution The resist pattern was a line-and-space pattern 0.27 μm wide with a clear rectangular cross section. The exposure energy was 38 mJ/cm$^2$.

EXAMPLE VII

A resist pattern was formed in a similar manner to that of Example VI, except for using 1.3 weight parts of triphenylsulfonium hexafluoroantimonate, instead of 1.2 weight parts of triphenylsulfonium triflate. The resist pattern was a line-and-space pattern 0.26 μm wide with a clear rectangular cross section. The exposure energy was 29 mJ/cm$^3$.

As described hereinbefore, the positive photoresist of the present invention can allow any radiation, including uv light, deep uv light and charged particle beam, such as l-line, excimer laser and electron beam, to be used, and is superior in resolution, thermal resistance, etch resistance, and post-exposure storage stability so that it can be applied for the high integration of semiconductor devices, irrespective of kinds of substrate.

What is claimed is:

1. A polymer ranging, in polystyrene-reduced average molecular weight, from approximately 1,000 to 1,000,000, represented by the following the following general formula I:

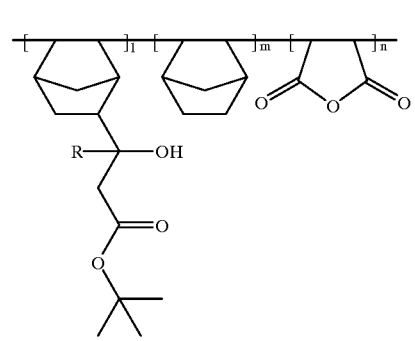

wherein, R is hydrogen or alkyl; and l, m, and n each are a repeating number satisfying the condition that l+m+n=1, 0.1≦l/(m+n)≦0.5, 0≦m/(l+n)≦0.5 and 0.1≦n/(l+m)≦0.9.

2. A chemical amplification positive photoresist composition comprising a polymer represented by the following general formula I:

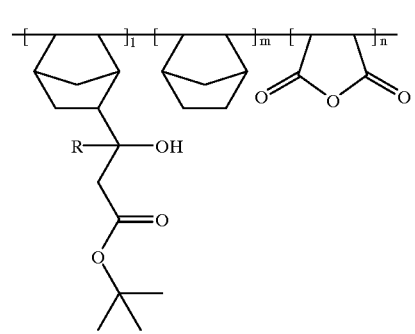

wherein R is hydrogen or alkyl; and l, m, and n each are a repeating number satisfying the condition that l+m+n=1, 0.1≦l/(m+n)≦0.5, 0≦m/(l+n)≦0.5 and 0.1≦n/(l+m)≦0.9, and a photoacid generator able to generate acid upon radiation.

3. A chemical amplification positive photoresist composition as set forth in claim 2, wherein said photoacid generator is selected from the group consisting of triphenylsulfonium triflate, diphenyl(4-methylphenyl)sulfonium triflate, diphenyl(4-t-butylphenyl)sulfonium triflate, diphenyl(4-methoxyphenyl)sulfonium triflate, dibutyl (naphthalen-1-yl)sulfonium triflate, triphenylsulonium hexafluoroantimonate, diphenyliodonium triflate, diphenyl iodonium methylbenzenesulfonate, bis(cyclohexylsulfonyl)diazomethane, bis(2,4-dimethylphenylsulfonyl) diazomethane, 1,1-bis(4-chlorophenyl)-2,2,2-tricholorethane, phenyl-bis(trichloromethyl)-s-triazine, naphthyl-bis(trichloromethyl)-s-triazine and the mixtures thereof.

* * * * *